United States Patent
To et al.

(10) Patent No.: US 10,763,782 B1
(45) Date of Patent: Sep. 1, 2020

(54) TUNABLE INDUCTORS

(71) Applicant: NXP USA, Inc., Austin, TX (US)

(72) Inventors: Kun-Hin To, Gilbert, AZ (US); David Gareth Morgan, Phoenix, AZ (US); Jay Paul John, Chandler, AZ (US); James Albert Kirchgessner, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/775,384

(22) Filed: Jan. 29, 2020

(51) Int. Cl.
*H03B 5/18* (2006.01)
*H01F 5/00* (2006.01)
*H03B 5/08* (2006.01)
*H03B 9/14* (2006.01)
*H03B 5/20* (2006.01)

(52) U.S. Cl.
CPC ............... *H03B 5/08* (2013.01); *H03B 5/18* (2013.01); *H03B 5/20* (2013.01); *H03B 9/141* (2013.01)

(58) Field of Classification Search
CPC combination set(s) only.
See application file for complete search history.

(56) References Cited

U.S. PATENT DOCUMENTS

| 4,035,695 A * | 7/1977 | Knutson ............. H01F 17/0006 361/782 |
| 5,239,289 A | 8/1993 | Ferraiola et al. |
| 5,990,752 A | 11/1999 | Papazian et al. |
| 6,369,683 B1 | 4/2002 | Iida et al. |
| 6,404,319 B1 | 6/2002 | Iida et al. |
| 2001/0035808 A1 | 11/2001 | Iida et al. |

OTHER PUBLICATIONS

H. Li et al., "Millimeter-Wave VCOs With Wide Tuning Range and Low Phase Noise, Fully Integrated in a SiGe Bipolar Production Technology," IEEE Journal of Solid-State Circuits, vol. 38, No. 2, pp. 184-191, Feb. 2003.
G. G. Fischer et al., "SiGe:C BiCMOS Technologies for Automotive Radar Applications," ECS Transactions, vol. 16, No. 10, pp. 1041-1051, 2008.
S. T. Nicolson et al., "A Low-Voltage SiGe BiCMOS 77-GHz Automotive Radar Chipset," IEEE Transactions on Microwave Theory and Techniques, vol. 56, No. 5, pp. 1092-1104, May 2008.

* cited by examiner

*Primary Examiner* — An T Luu

(57) ABSTRACT

A technique for tuning a ladder-shaped inductor that achieves a finer tuning resolution by severing one or more shorts, skipping the severing of one or more shorts, and severing one or more subsequent shorts within the ladder-shaped inductor. This technique can be applied to a voltage-controlled oscillator using a differential or single-ended ladder-shaped inductor as part of the resonant circuit. Within an oscillator, such a technique provides for a more precise modulation of the effective inductance of the ladder-shaped inductor, which enables an improved tuning resolution of the operating frequency of the oscillator.

20 Claims, 11 Drawing Sheets

TUNABLE INDUCTORS

TECHNICAL FIELD

The present disclosure relates in general to adjusting the effective inductance of tunable inductors and, in particular, to tuning the operating frequency of oscillators incorporating such tunable inductors.

BACKGROUND

An inductor, also called a coil or reactor, is a passive two-terminal electrical component that resists changes in electric current passing through it. Inductors are used in analog circuits and signal processing benefiting applications in power supply, electric utility, and radio frequency. In the manufacture of electronic equipment, tunable inductors are often utilized. Due to its miniaturization, inductors formed within circuits are usually capable of being tuned by physically altering the inductor to adjust its effective inductance. These tunable inductors are manufactured into a circuit that is then tuned to within desired operational limits by adjusting the effective inductance of such tunable inductors. There have been a number of basic ways of achieving this goal. Often a spiral-shaped inductor or a ladder-shaped inductor with multiple parallel shorts (also referred to herein as links or rungs) is utilized.

The ladder-shaped inductor is useful where fine tuning is required but space is not a premium consideration. Its inductance can be varied by severing (also referred to herein as breaching or trimming) one or more of the shorts across its vertical legs. The obtainable variance in inductance is substantially predictable and correlates to the number of, and spacing of, the ladder shorts.

Voltage-controlled oscillators used in communications circuits often make use of ladder-shaped inductors that can be adjusted in which a set of adjacent shorts can be severed in a single-ended fashion as part of a resonant circuit to overcome the impact of process variability on free-running oscillation frequency at a fixed tuning voltage. Such voltage-controlled oscillators may be utilized within automotive radar systems. The frequency can be lowered by severing one or more shorts in the ladder-shaped inductors to have a larger effective inductance. The increase of effective inductance by each severed short is however limited by the spacing between the shorts, which is constrained by the layout design rules. For example, a current tuning resolution for implementation of such ladder-shaped inductors on silicon is about 850 MHz-1000 MHz per short. There is therefore a desire for a more precise obtainable resolution of inductive values within such inductors so that a narrower oscillation frequency distribution of the circuits can be obtained, which in turn improves the yield during manufacturing of integrated circuits incorporating oscillators that implement such ladder-shaped inductors.

DETAILED DESCRIPTION

Embodiments of the present disclosure provide a technique for tuning a ladder-shaped inductor that achieves a more precise tuning resolution than can be achieved with prior art techniques that sever a set of adjacently positioned ladder shorts (e.g., consecutively arranged shorts severed in a sequential order). In accordance with embodiments of the present disclosure, a ladder-shaped inductor is tuned (i.e., its effective inductance adjusted) by severing a first set of one or more adjacent shorts that lie nearest to the inductor terminals, not severing a second set of one or more shorts (which, if more than one, they may be adjacent to each other or not), and severing a third set of one or more shorts, wherein the second set of one or more shorts are positioned between the first and third sets. Such a technique more precisely adjusts the effective inductance of the ladder-shaped inductor. When this technique is applied to a voltage-controlled oscillator ("VCO") using a differential or single-ended ladder-shaped inductor as part of the LC tank (i.e., the resonant circuit), a more precise tuning resolution can be achieved than is possible with prior art techniques, which are limited by the spacing between shorts in the ladder-shaped inductor. Additionally, embodiments of the present disclosure can also be applied to any matching network using a ladder-shaped inductor for impedance tuning.

Figure 1:
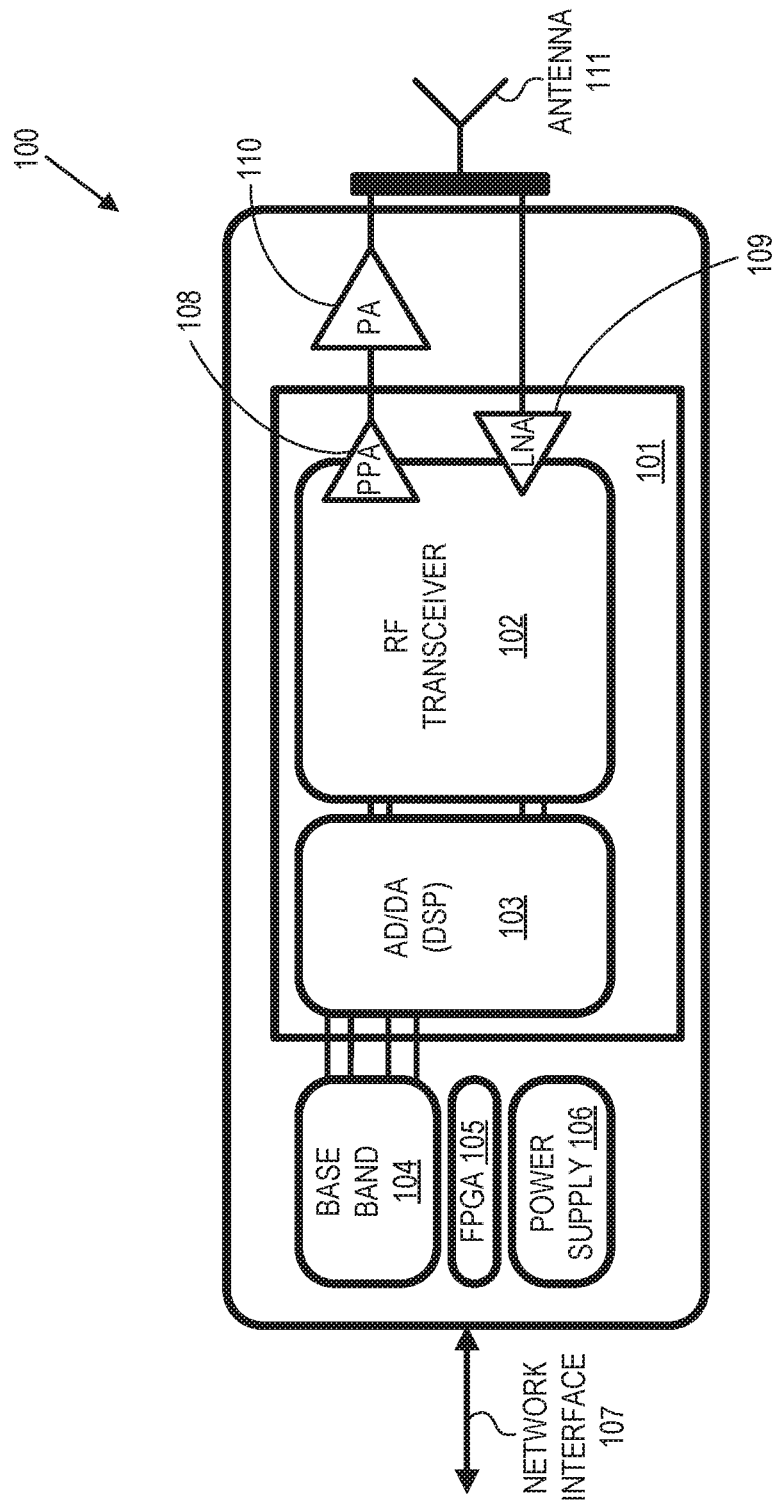
FIG. 1 illustrates an exemplary communications device configured in accordance with embodiments of the present disclosure.

FIG. 1 illustrates an exemplary communications device 100 that may be configured in accordance with embodiments of the present disclosure. All or portions of the components illustrated within the communications device 100 may be implemented on one or more integrated circuits ("ICs" or "chips"). For example, the DSP 103 and RF transceiver 102 may be implemented on a single chip 101. The RF transceiver 102, which is further described with respect to FIG. 2, transmits a signal, which may be amplified by a pre-power amplifier 108 and then a subsequent power amplifier 110 before being transmitted by an antenna 111. Communication signals received by the device 100 may be received by the antenna 111, which is then filtered by a low noise amplifier ("LNA") 109 before being processed within the RF transceiver 102. Note that in such communications devices 100, separate transmitting and receiving antennas may be utilized.

The analog communication signals processed by the RF transceiver 102 may be transformed into the digital realm by a DSP 103, which may implement analog-to-digital and digital-to-analog ("AD/DA") circuitry. Such a communications device 100 may include other elements, such as a baseband unit 104, a field-programmable gate array ("FPGA") unit 105, and a power supply 106. Information to be transmitted and received by the device 100 may be communicated over a network interface 107 to other systems (not shown). The communications device 100 may be utilized within an automotive radar system incorporated within a transportation vehicle. In accordance with embodiments of the present disclosure, the communications device 100 is not limited to the configuration disclosed herein, but may have other configurations and/or include other devices in other embodiments.

Figure 2:
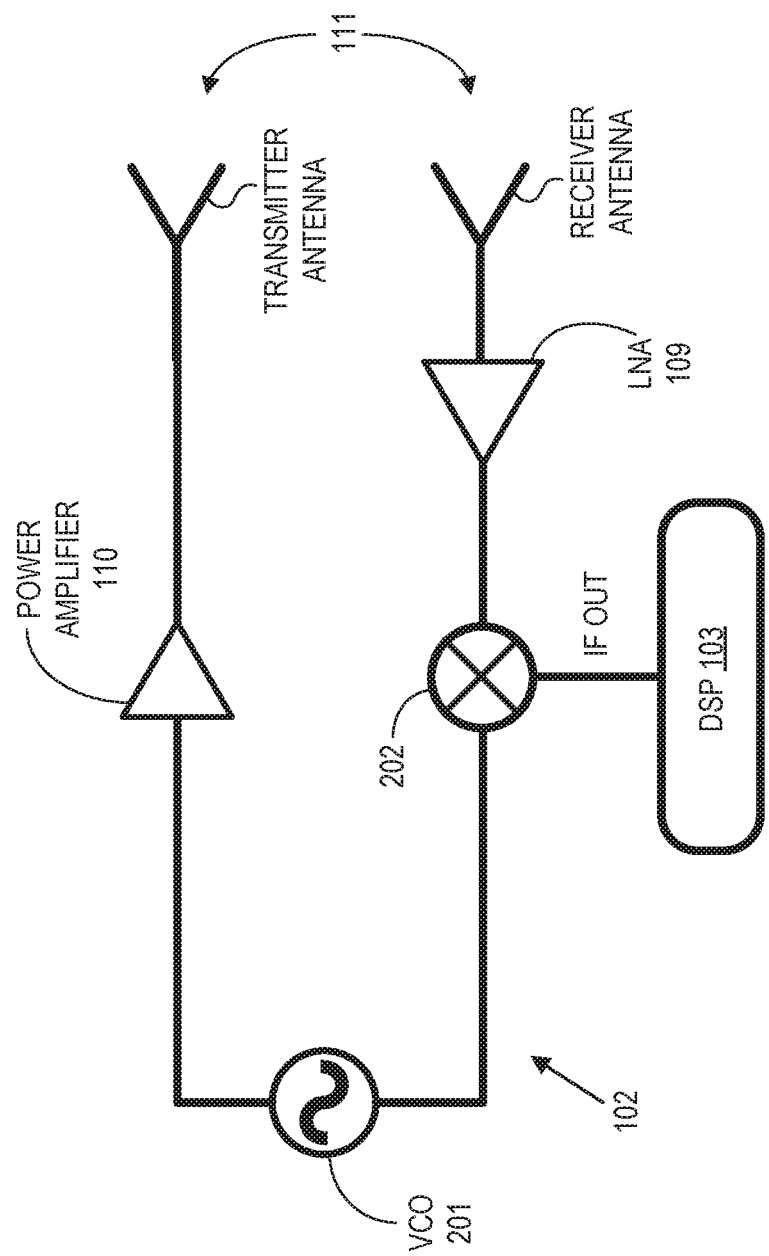
FIG. 2 illustrates a schematic diagram of an exemplary radar transceiver configured in accordance with embodiments of the present disclosure.

FIG. 2 illustrates a simplified schematic diagram of the RF transceiver 102. Though separate transmitter and receiver antennas are illustrated in this figure, these may be incorporated within a single antenna 111. As previously noted with respect to FIG. 1, the RF transceiver 102 may be implemented within an automotive radar. As such, a radar signal wave may be generated by the VCO 201 and delivered to the transmitter antenna 111 via the power amplifier 110. On the receiver side, the incoming signal is first amplified by the LNA 109. In the mixer 202, the oscillator and receiver radar signals are down-converted to a lower intermediate frequency, which is used for further digital signal processing by the DSP 103.

Figure 3:
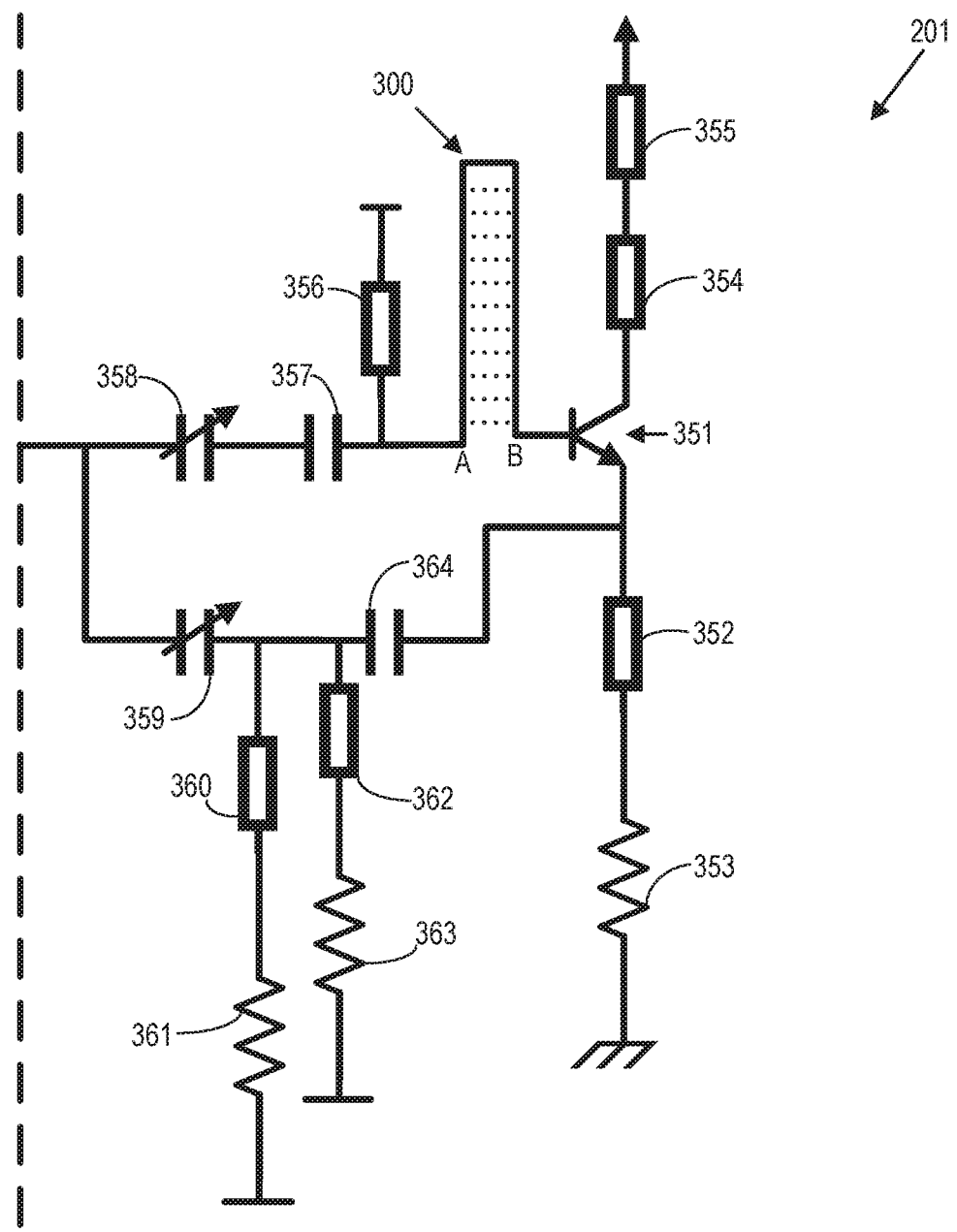
FIG. 3 illustrates a simplified schematic diagram of an exemplary differential voltage-controlled oscillator ("VCO") configured in accordance with embodiments of the present disclosure.

FIG. 3 illustrates a simplified schematic diagram of an exemplary voltage-controlled oscillator (e.g., the VCO 201), which may be utilized within the circuitry described with respect to FIGS. 1 and 2. Such a VCO 201 may be implemented with a resonant circuit (also referred to herein as an LC tank) for producing one or more oscillating frequencies required within the VCO 201. In accordance with embodiments of the present disclosure, such an LC tank may be implemented with a ladder-shaped inductor 300, which is tunable (its inductance can be adjusted) as described herein so that the VCO 201 is tuned to a target (or desired) frequency or frequency range. The frequency of a resonant circuit is inversely related to the inductance of an inductor in the circuit. By increasing the value of inductance, a circuit will have a lower frequency; and by decreasing the value of an inductor, a circuit will have a higher frequency. The exemplary VCO 201 may further include other elements such as the capacitors 357, 364, the varactors 358, 359, the resistors 353, 361, 363, and microstrips 355, 354, 352, 356, 360, 362. One or more of these elements may be combined with the ladder-shaped inductor 300 in a well-known manner to form an LC tank. The microstrips 355, 354, 352, 356, 360, 362 may be configured in a well-known manner as various circuit elements implemented within a voltage-controlled oscillator (e.g., resistor, capacitor, transistor). The VCO 201 may be coupled to the RF transceiver 102 at the node between the elements 354 and 355. For purposes of this disclosure, other than the ladder-shaped inductor 300, the other various elements of the VCO 201 are not further described for the sake of simplicity. Nevertheless, it should be understood that any voltage-controlled oscillator that utilizes a resonant circuit may be configured with one or more such ladder-shaped inductors configured in accordance with embodiments of the present disclosure.

Figure 4:
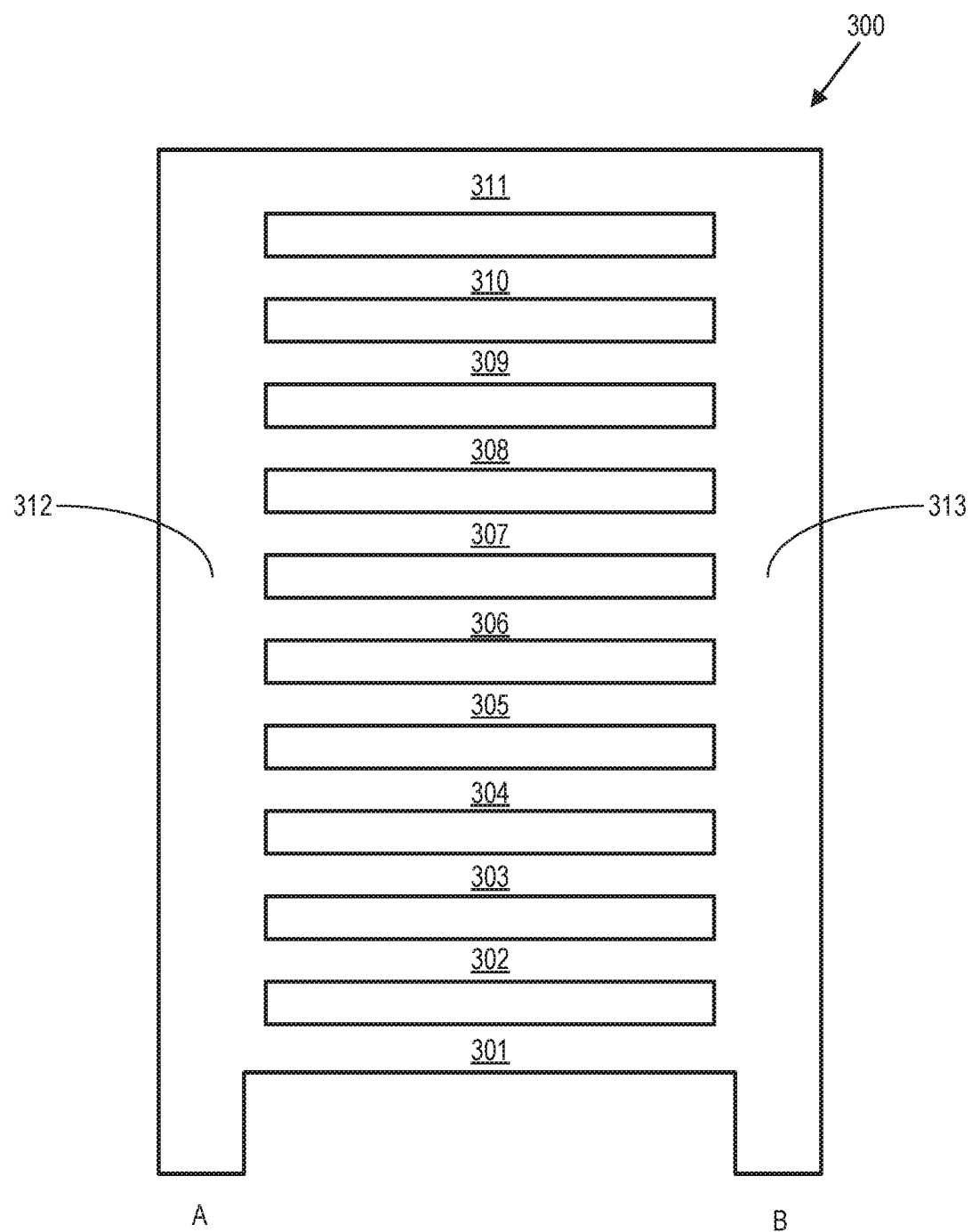
FIG. 4 illustrates a representation of a ladder-shaped inductor.

FIG. 4 further illustrates a simplified representation of such a ladder-shaped inductor 300. The word "ladder" as used herein to denote the shape of such a tunable inductor is intended to include a broad class of shapes in which there are two adjacent lines, which may be substantially parallel and connected at one end. Further, the tunable inductor in this shape includes shorts interconnecting or bridging these two lines. These shorts may be arranged in a substantially parallel manner relative to each other.

Such a ladder-shaped inductor 300 may be formed by using any well-known technology. For example, a pair of conductive strips may be disposed upon an insulative substrate (not shown). This pair of conductive strips form the two lines, or legs, 312 and 313 of the ladder-shaped inductor 300. Selected adjacent sections of the lines 312 and 313 are shorted together by disposing additional conductive strips upon the substrate, forming a tunable inductor. By way of example only, the exemplary tunable ladder-shaped inductor 300 is implemented with the conductive strips 301-311, which may also be referred to herein as links, shorts, or rungs. Embodiments of the present disclosure are not limited to ladder-shaped inductors having the number of shorts illustrated in the various figures.

The shorts 301-311 form shortened conducting paths across the ladder-shaped inductor 300. In principal, with such ladder-shaped inductors, the outermost short in nearest proximity to the inductor terminals (labelled as nodes A and B) that has not been severed (e.g., the short 301 of the inductor illustrated in FIG. 4, or the short 505 of the inductor illustrated in FIG. 5) allows the majority of the current to flow directly across; as a result, the remaining shorts (e.g., the shorts 302-311 of the inductor illustrated in FIG. 4, or the shorts 506-511 of the inductor illustrated in FIG. 5) will have relatively little effect on establishment of the effective inductance of the inductor, since the majority of the current will flow through the unsevered short. Once an outermost short (e.g., the short 301) is severed, the inductance of the ladder-shaped inductor will rise and the current will flow primarily through the next outermost short in nearest proximity to the nodes A and B (e.g., the short 302). Note that in accordance with embodiments of the present disclosure, the shorts, links, or rungs of a ladder-shaped inductor may be referred to as being severed, breached, or trimmed, which can be performed utilizing any well-known technique such as with a laser beam, sand abrasion, drilling, or other mechanical means. To sever a short means to create an open circuit so that the short is not capable of conducting electricity.

In accordance with prior art techniques, the shorts of such a ladder-shaped inductor are consecutively severed in a sequential order, beginning with the outermost short in nearest proximity to the inductor terminals (relative to the other shorts), in order to tune an operable circuit (e.g., a VCO) to a desired frequency. As used herein, the term "sequential" refers to shorts that are adjacent to each other. As such, severing of sequential shorts refers to severing of two or more adjacent shorts, though the act of severing of the shorts may be performed in any order.

The tuning of a ladder-shaped inductor may be performed either before or after the population of the circuit components (such as the exemplary circuit components illustrated in FIG. 3). However, generally it is tuned after the circuit is otherwise complete and components are added. Once the circuit that includes the tunable ladder-shaped inductor is formed, it may be tested to determine its current operating frequency. The current operating frequency is subtracted from a target operating frequency to determine the desired decrease in operating frequency that might be required to reach the target operating frequency, and as a consequence, the required increase in inductance needed from the tunable ladder-shaped inductor. One or more of the outermost shorts nearest to the terminals on the tunable ladder-shaped inductor are severed. The circuit may again be tested to determine its updated operating frequency, and one or more additional shorts severed without causing the effective inductance to rise above a target value, thus producing a circuit tuned to within the available resolution of the target.

Figure 5:
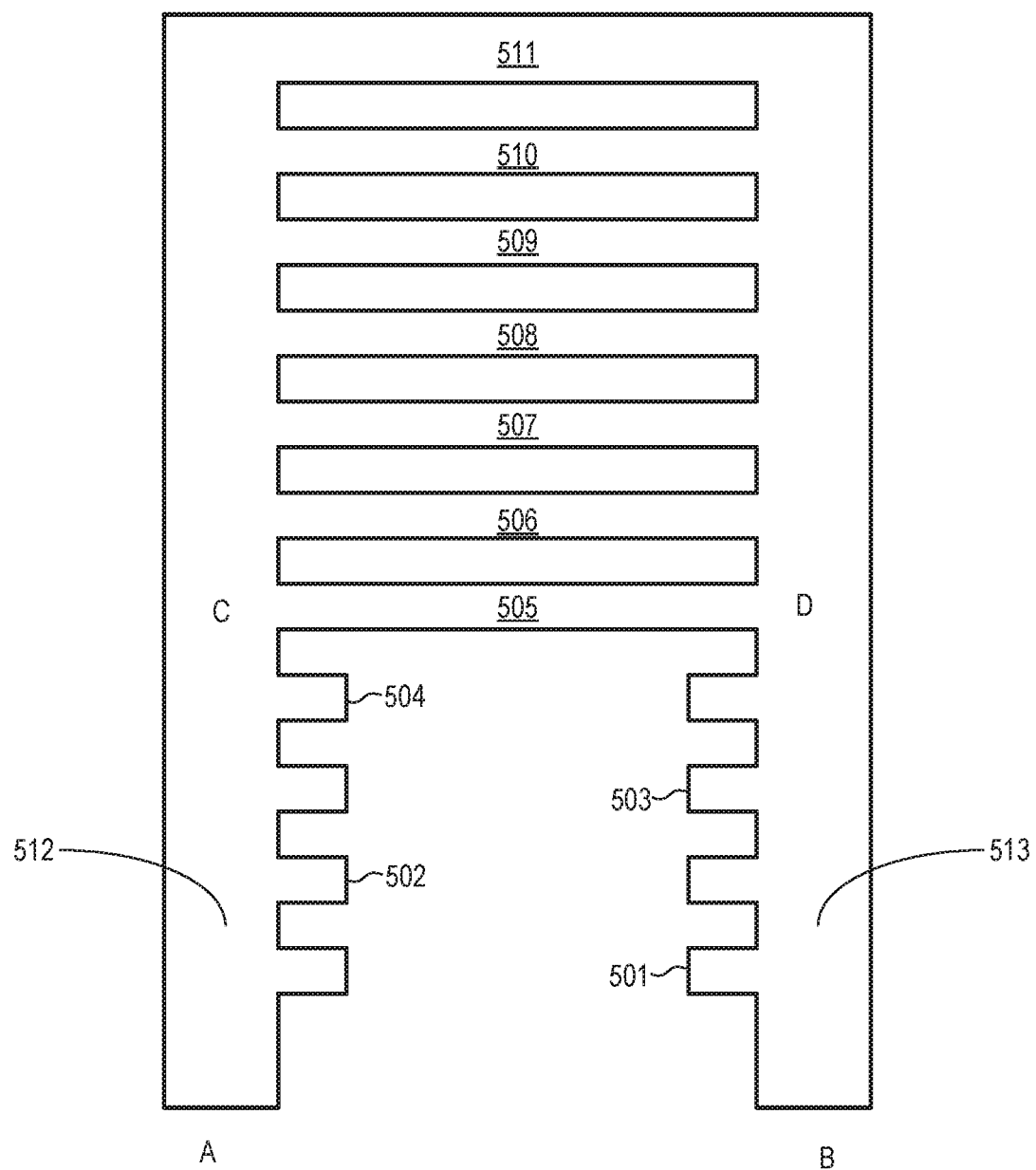
FIG. 5 illustrates an example of tuning of a ladder-shaped inductor according to the prior art.

FIG. 5 illustrates an example of how such a ladder-shaped inductor is tuned in accordance with the prior art by severing one or more of the outermost shorts positioned in nearest proximity to the inductor terminals denoted by nodes A and B (relative to the other shorts). For purposes of comparison with embodiments of the present disclosure, the exemplary ladder-shaped inductor 500 has a configuration similar to the ladder-shaped inductor 300, with elements 501-513 similar to elements 301-313. FIG. 5 demonstrates a sequential severing of the shorts 501-504 to adjust the inductance of the ladder-shaped inductor 500 (e.g., in order to produce a desired operating frequency for an operable circuit within which the ladder-shaped inductor 500 is implemented (e.g., a VCO)).

In contrast, instead of severing sequential shorts in such a manner, embodiments of the present disclosure utilize a technique in which non-sequential shorts are severed in order to adjust the effective inductance of a ladder-shaped inductor. A first set of one or more sequential shorts positioned in nearest proximity to the terminals of the ladder-shaped inductor (e.g., see the nodes A and B of the ladder-shaped inductor 300 in FIG. 3) are severed. A more precise adjustment of the effective inductance can be achieved by (1) not severing a second set of one or more of the shorts (also referred to herein as "skipped short(s)") positioned in nearest proximity to the first set of one or more sequential shorts that were previously severed, and (2) severing a third set of one or more shorts that lie on the other side of the second set of skipped short(s). The severing of the third set of one or more shorts results in a smaller increase of effective inductance of the ladder-shaped inductor than would be accomplished by severing an additional short in the first set, since such an increase is a result of the increased inductance resulting from severing the third set in parallel with the increased inductance resulting from the skipped short(s). The severing of the third set in effect does not "directly" contribute to the increase of inductance of the ladder-shaped inductor due to the fact that the effective inductance of the third set and the remainder of the ladder-shaped inductor is in parallel with the effective inductance of the second set.

Figure 6:
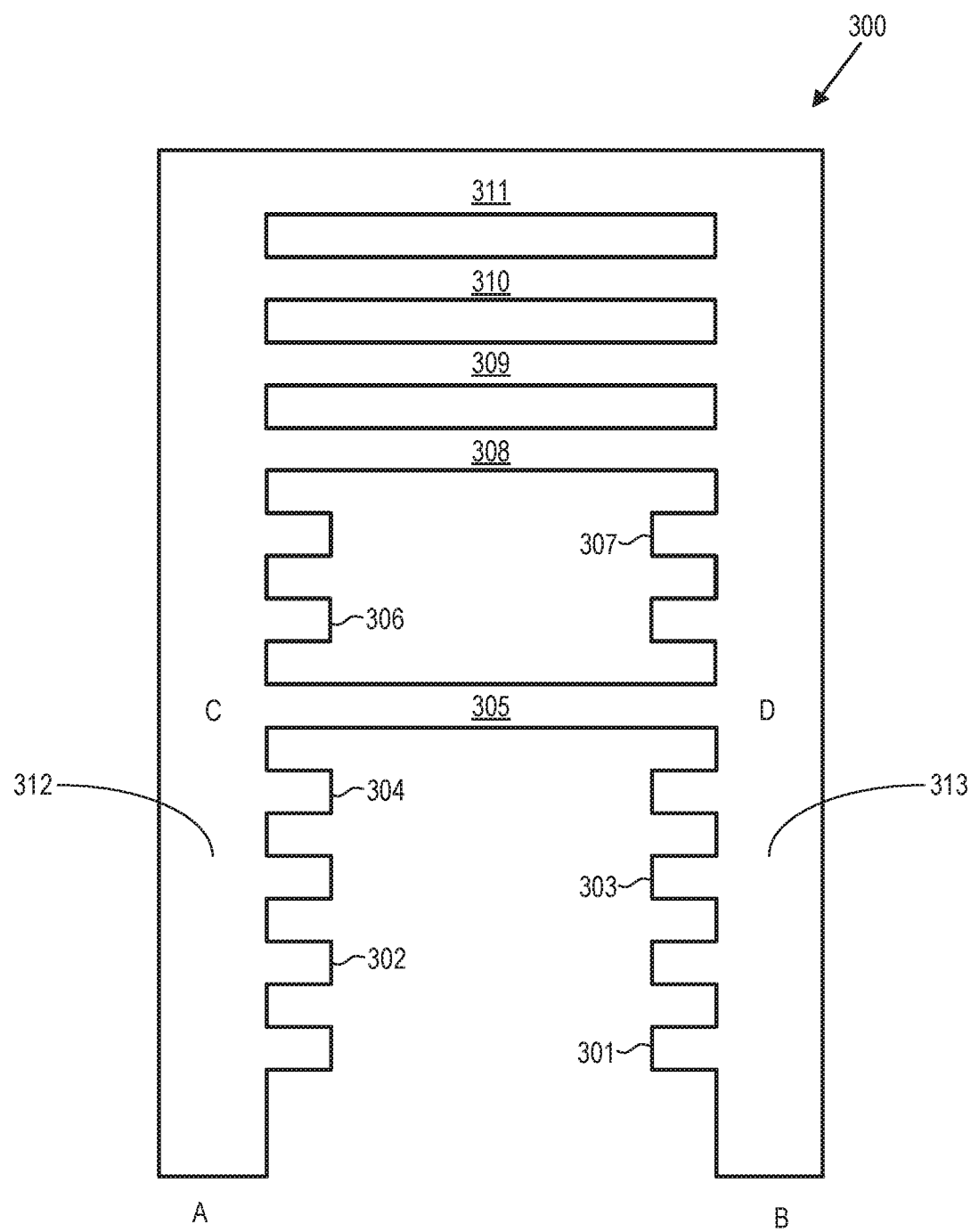
FIG. 6 illustrates a non-limiting example of a ladder-shaped inductor tuned in accordance with embodiments of the present disclosure.

FIG. 6 illustrates a non-limiting example of the severing of shorts within a ladder-shaped inductor (e.g., the ladder-shaped inductor 300 of FIGS. 3 and 4) in accordance with embodiments of the present disclosure. In this particular example, the effective inductance of the ladder-shaped inductor 300 has been adjusted by severing a first set of one or more shorts that are nearest to the inductor terminals (i.e., the shorts 301-304), not severing a second set of one or more shorts that are adjacent to the first set (i.e., the short 305), and severing a third set of one or more shorts that are adjacent to the second set (i.e., the shorts 306-307). Note that, depending upon a desired adjustment to the effective inductance, embodiments of the present disclosure contemplate the severing of any number of one or more shorts in the first set of shorts nearest in proximity to the inductor terminals, the skipping (i.e., not severing) of any number of one or more shorts in the second set, and the severing of any number of one or more shorts in the third set.

Since the effective inductive values associated with each part of the ladder-shaped inductor and the change in effective inductance associated with the severing of each of the shorts are known, embodiments of the present disclosure may be implemented by a determination of how many shorts are to be included within each of the first, second, and third sets, and then a severing of the determined shorts in the first and third sets in any desired order (e.g., other than a severing beginning with the outermost short nearest to the inductor terminals and then proceeding inward to subsequent severing of shorts).

Alternatively, in accordance with certain embodiments of the present disclosure, the first set of short(s) may be severed, and then the third set of short(s) severed, which may include multiple measurements of the operating frequency of the associated resonant circuit in between severing of shorts.

Figure 7:
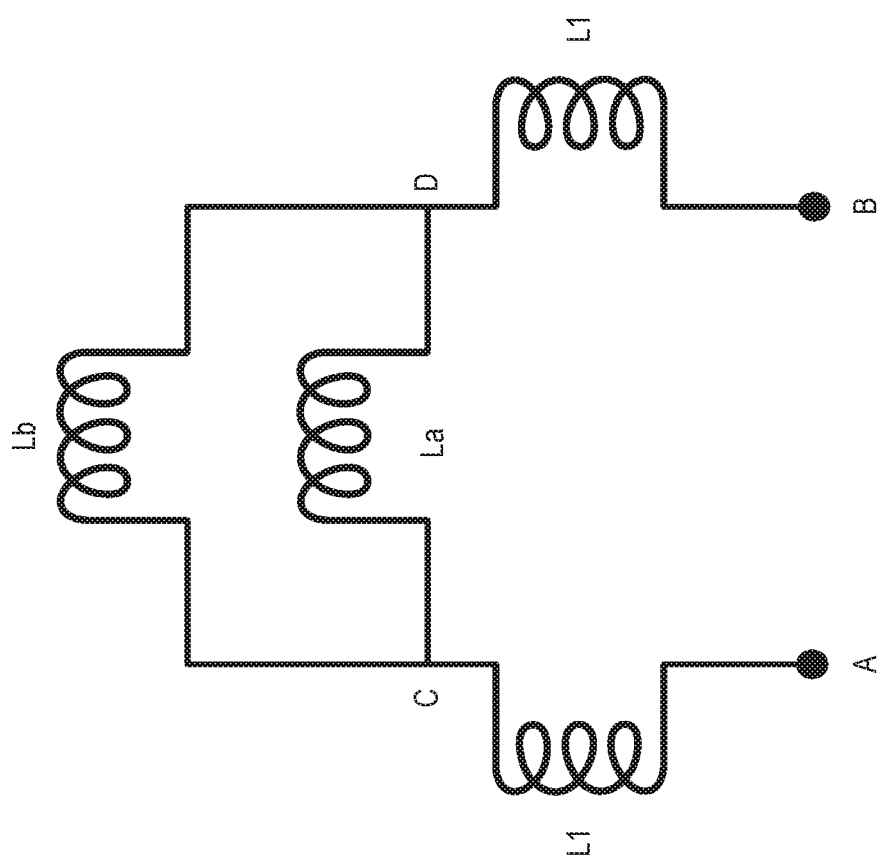
FIG. 7 illustrates a simplified circuit diagram representing inductive values within a ladder-shaped inductor.
Figure 8:
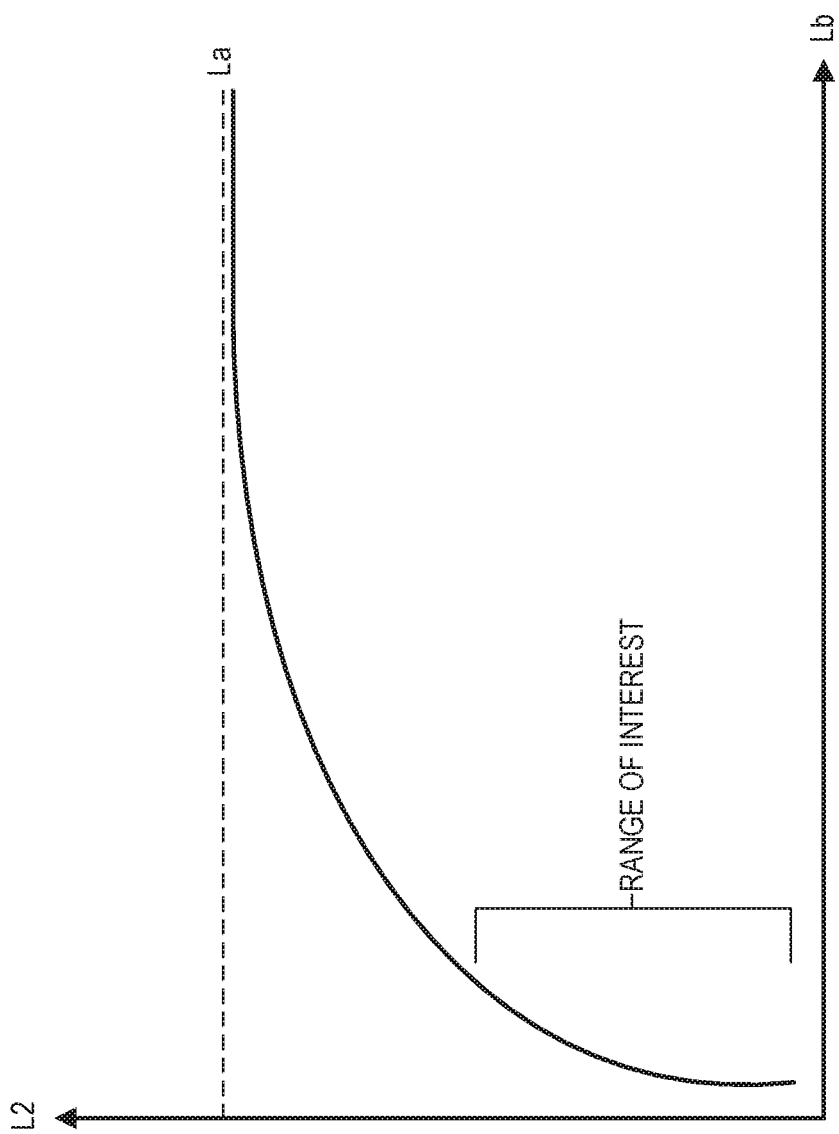
FIG. 8 illustrates a plot demonstrating a range of interest of a variance in inductive values considered in accordance with embodiments of the present disclosure.

A theoretical basis for embodiments of the present disclosure can be described with respect to FIGS. 7 and 8. As previously noted, embodiments of the present disclosure tune a ladder-shaped inductor by severing non-consecutively arranged shorts. This is non-intuitive, since if it is assumed that the first unsevered short is a perfect electrical short circuit, severing shorts beyond that unsevered short would not alter the effective inductance. However, the first unsevered short is not a perfect electrical short circuit and thus it is possible to obtain a more precise level of tuning precision with the skipped link approach of the present disclosure.

FIG. 7 illustrates a circuit diagram representing the various inductive values associated with a ladder-shaped inductor (e.g., the ladder-shaped inductor 300 or the ladder-shaped inductor 500). L1 represents the effective inductance produced by those portions of each of the legs associated with the severed short(s) in the first set. For example, with respect to the ladder-shaped inductor 500 illustrated in FIG. 5, L1 represents the effective inductance produced by those portions of each of the legs 512 and 513 associated with the severed shorts 501-504. Similarly, for example, with respect to the ladder-shaped inductor 300 illustrated in FIG. 6, L1 represents the effective inductance produced by those portions of each of the legs 312 and 313 associated with the severed shorts 301-304. La represents the effective inductance of the first short that is not severed subsequent to the one or more severed sequential shorts. Therefore, in the case of a prior art ladder-shaped inductor (e.g., the ladder-shaped inductor 500 of FIG. 5), La represents the effective inductance of the short 505. Lb represents the effective inductance in parallel with La. In the example of FIG. 5, Lb represents the effective inductance of the portion of the ladder-shaped inductor 500 that includes the unsevered shorts 506-511.

Now designate L to represent the effective inductance of the ladder-shaped inductor (e.g., the ladder-shaped inductor 300 or the ladder-shaped inductor 500) looking into node A and node B (i.e., the effective inductance of the entire ladder-shaped inductor as presented to circuitry coupled to the inductor). Designate L2 to represent the effective inductance produced by the portion of the ladder-shaped inductor subsequent to the severed shorts (i.e., the effective inductance "looking into" node C and node D), which would remain approximately constant even with each additional severance of a short. Designate $\Delta L$ to represent the increase in effective inductance produced by each of the legs 312 and 313 (or each of the legs 512 and 513) with each additional severance of a short. Consequently, it can be readily determined that $L=2*L1+L2$. And, L is increased by $2*\Delta L$ with each additional severance of a short.

Referring again to FIG. 6, as previously noted, La represents the effective inductance of the first short that is not severed subsequent to the one or more severed sequential shorts. Therefore, in the example of FIG. 6, La represents the effective inductance of the short 305. Lb represents the effective inductance of the portion of the ladder-shaped inductor 300 that includes the severed shorts 306-307 and the unsevered shorts 308-311. In this particular example where one of the shorts 305 has not been severed, without loss of generality for embodiments in which multiple shorts are not severed, the inductance values for the ladder-shaped inductor 300 as illustrated within FIG. 6 can again be represented by the equation 1/L2=1/La+1/Lb.

This equation can be represented by the graph illustrated in FIG. 8. Note that the effective inductance Lb increases with the severing of the subsequent shorts (e.g., the shorts 306-307) after the skipped unsevered short 305. As the effective inductance Lb approaches infinity, the effective inductance L2 approaches the effective inductance La. Therefore, it can be seen that with subsequent severing of shorts after the unsevered short, the increase of the effective inductance L equals the increase of the effective inductance L2. It is therefore the range of interest of inductive values shown in FIG. 8 that is of interest to embodiments of the present disclosure, since this represents the additional increase in effective inductance that can be achieved with severing of one or more subsequent shorts after the unsevered short(s) in order to obtain a more precise resolution of frequency distribution within the oscillator.

Note that, in accordance with embodiments of the present disclosure, the relative values of the effective inductances L2 and ΔL can be modified to cover the designed frequency resolution by adjusting the width and/or length of various parts of the ladder-shaped inductor 300 when permitted by design parameters within the manufacturing processes. For example, by increasing the lengths of the shorts, the effective inductance La can be increased to provide a larger coverage.

When the ladder-shaped inductor 300 is used in a VCO (e.g., the VCO 201) as part of an LC tank, the operating frequency can be represented as:

$$Fosc \propto \frac{1}{2\pi\sqrt{CtotalLtotal}}$$

Assuming $\Delta L_{total}/L_{total} \ll 1$, then $\Delta Fosc \propto \Delta Ltotal$, which results in $\Delta Fosc \propto \Delta L2$. Note that in practice, the proportional relationship between inductance and Fosc may not be exactly linear, but the trend in this relationship should remain approximately the same.

Figure 9:
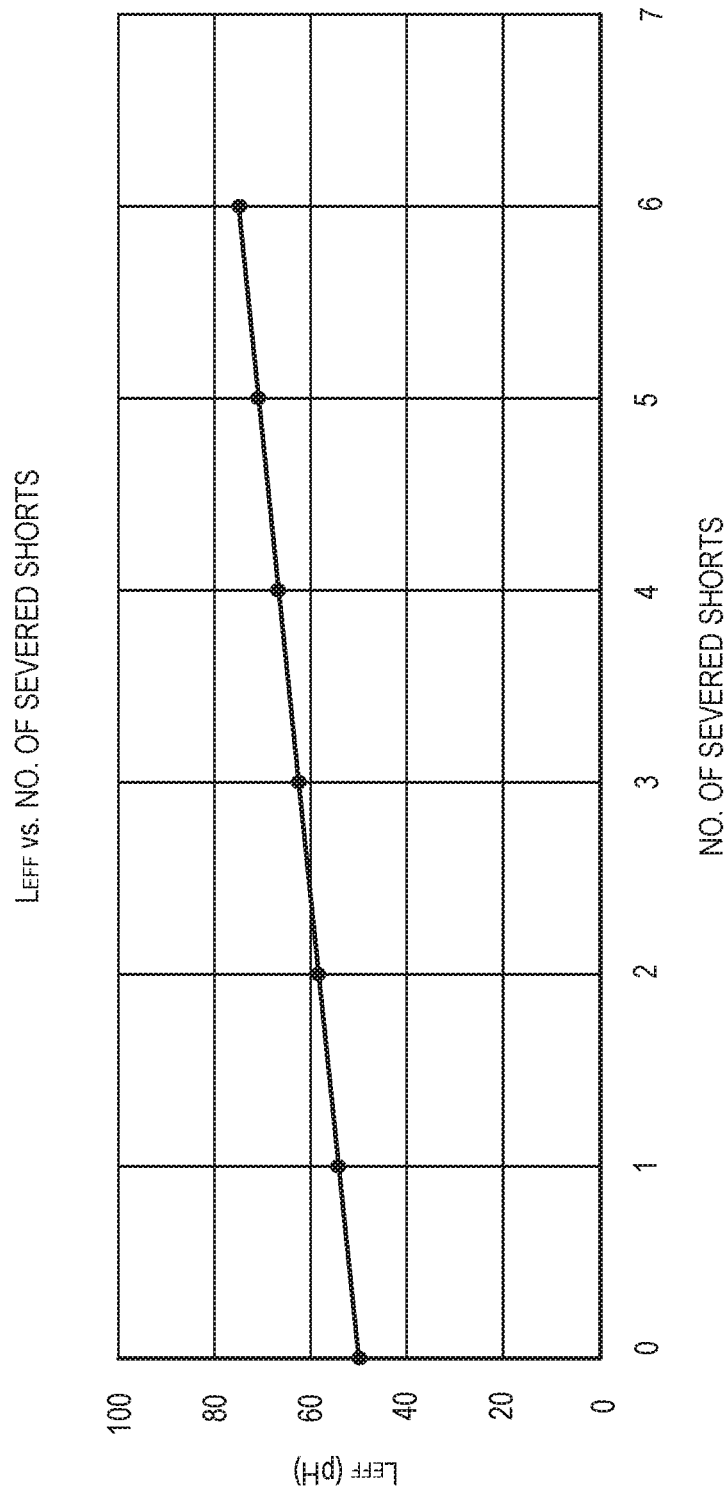
FIG. 9 illustrates a graph demonstrating an example of tuning of a ladder-shaped inductor in accordance with the prior art.

FIG. 9 illustrates a graph of how the effective inductance can be adjusted by severing of sequential shorts in accordance with the prior art, such as illustrated with respect to FIG. 5. The effective inductance (Leff) is adjusted in a very linear manner with such severing of sequential shorts.

Figure 10:
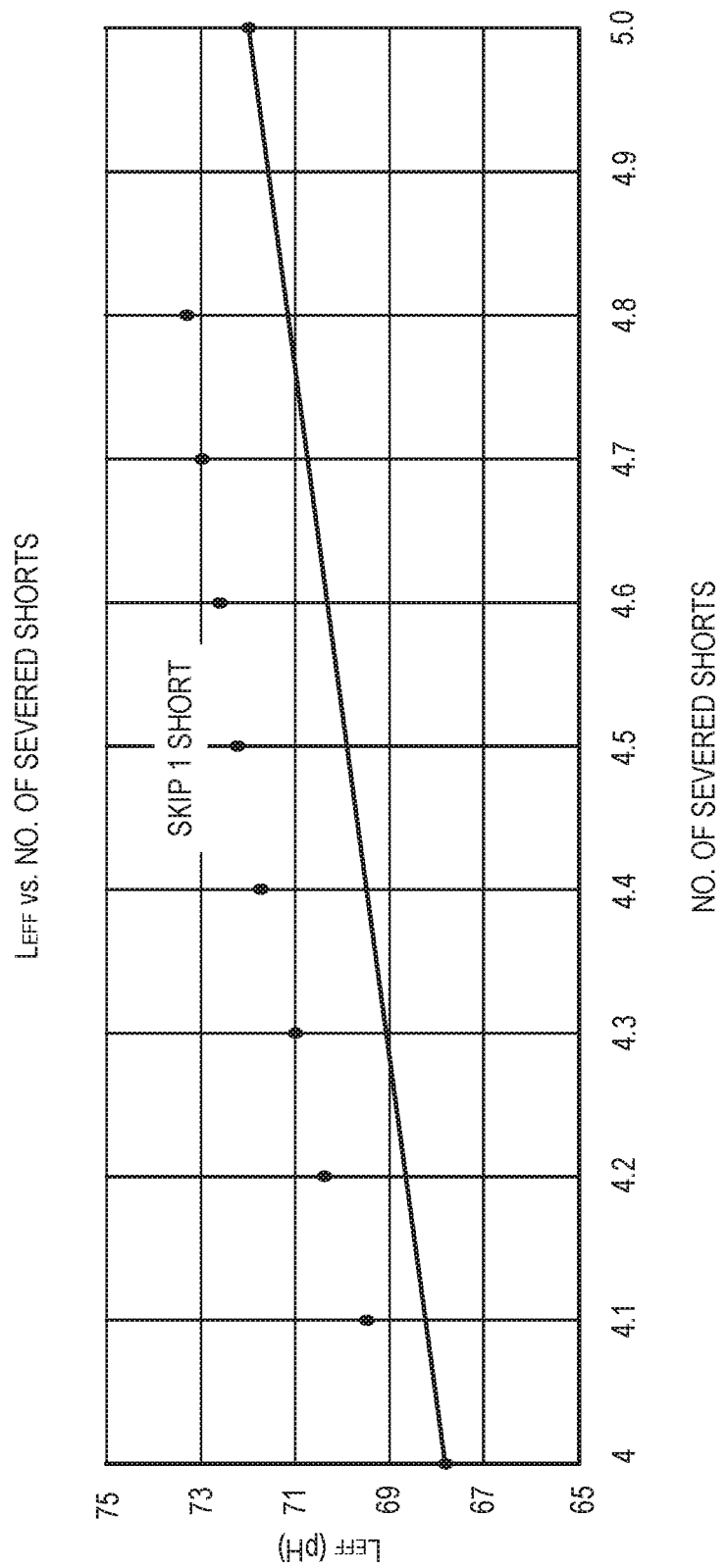
FIG. 10 illustrates a graph demonstrating an example of tuning of a ladder-shaped inductor in accordance with embodiments of the present disclosure.

In contrast, FIG. 10 illustrates a graph of an example of how embodiments of the present disclosure can adjust the effective inductance (Leff) with severing a first set of one or more sequential shorts, not severing a second set of one or more shorts, and severing a third set of one or more subsequent shorts, such as illustrated with respect to FIG. 6. Solely for purposes of illustration, the graph is shown with a third set having a potential of nine subsequent shorts that can be severed. FIG. 10 illustrates a non-limiting example of how the effective inductance (Leff) can be adjusted with severing a first set of four sequential shorts, not severing one short, and severing one or more subsequent shorts.

Therefore, consider an example in which it is desired that the effective inductance (Leff) of the ladder-shaped inductor (e.g., the ladder-shaped inductor 300) is adjusted to 71 pH.

In accordance with the prior art technique for adjusting the inductance of a ladder-shaped inductor (e.g., the ladder-shaped inductor 500), the best resolution that could be obtained would be with the severing of the first four shorts nearest to the inductor terminals (e.g., the shorts 501-504), which would obtain an effective inductance of about 68 pH. Severing of the next sequential short (i.e., the short 505) would obtain an effective inductance of about 72 pH, which would be too large. However, in accordance with embodiments of the present disclosure, the first set of sequential shorts can be severed (e.g., the shorts 301-304), the short 305 is not severed, and three subsequent shorts (e.g., the shorts 306-308) severed to obtain the effective inductance of about 71 pH. It can be readily seen that this technique enables an improved tuning resolution of an oscillator (e.g., the VCO 201).

Figure 11:
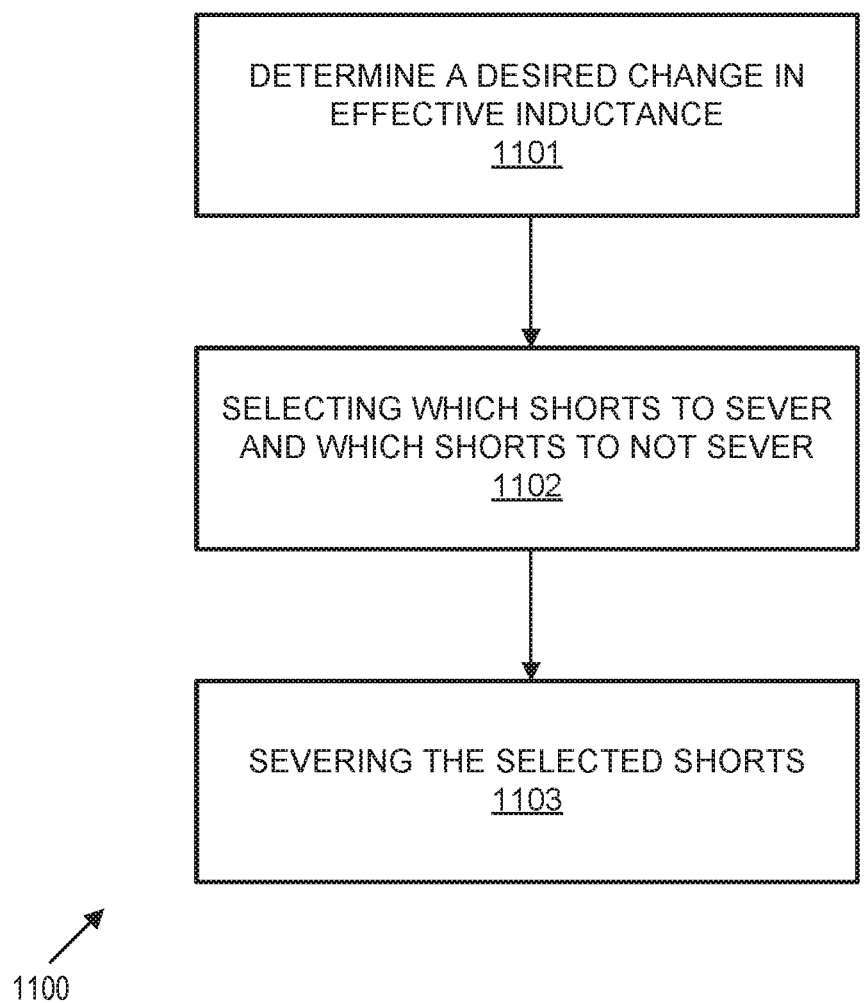
FIG. 11 illustrates a flow diagram configured in accordance with embodiments of the present disclosure.

FIG. 11 illustrates a flow diagram configured in accordance with embodiments of the present disclosure. The process 1100 may be utilized to adjust the effective inductance of a ladder-shaped inductor (e.g., the ladder-shaped inductor 300), such as for tuning the operating frequency of an oscillator (e.g., the oscillator 201). In the process block 1101, a determination is made as to how much to change the effective inductance of the ladder-shaped inductor. This desired change in the effective inductance may be correlated with a desired change in operating frequency of an oscillator implementing the ladder-shaped inductor. Since the inductive values associated with the various parts of the ladder-shaped inductor are known, in the process block 1102, it is determined which of the shorts to sever and which to not sever, which may include selecting which short(s) to that are included within the third set previously described. In the process block 1103, the selected shorts to be severed may be severed using any well-known technique.

If the ladder-shaped inductor is implemented within an oscillator, such as the VCO 201, the process 1100 may be implemented in accordance with the following non-limiting example. Such an exemplary oscillator may have a target operating frequency, designated as Fosc_target. Designate Fosc_$1^{st}$ as the operating frequency obtained after severing of the first set of one or more shorts in nearest proximity to the inductor terminals. Designate $\Delta 1^{st}$ as the change in frequency obtainable by severing a single short. Designate Fosc_$3^{rd}$ as the operating frequency obtained after severing of the third set of one or more shorts.

In the process block 1102, the number of shorts to sever in the first set may be selected so that the frequency Fosc_$1^{st}$ is larger than the target frequency Fosc_target AND the difference between Fosc_$1^{st}$ and Fosc_target is less than $\Delta 1^{st}$. Assuming a desire to only select one short for the second set to not be severed, then the frequency Fosc_$3^{rd}$ would be known after severing of any number of shorts in the third set.

Then, the process block 1102 may encounter either of two possible scenarios at this point. In a first possible scenario, after selecting the number of shorts to sever in the first set, it may be that the frequency Fosc_$1^{st}$ is closer to Fosc_target than it would be with any severing of shorts in the third set. In such a case, there is no need to perform any severing of shorts in the third set. If the first scenario is not true, then in a possible second scenario, the number of shorts to sever in the third set is selected so that the frequency Fosc_3rd is closest to the target frequency Fosc_target.

Embodiments of the present disclosure provide a method for tuning an oscillator that includes a ladder-shaped inductor, wherein the ladder-shaped inductor includes a pair of conductive strips and a plurality of conductive severable shorts disposed between adjacent sections of the pair of conductive strips, and wherein the method includes severing a first set of one or more of the conductive severable shorts, not severing a second set of one or more of the conductive severable shorts that lie physically adjacent to the first set of one or more of the conductive severable shorts, and severing a third set of one or more of the conductive severable shorts that lie physically adjacent to the second set of one or more of the conductive severable shorts. The first set of one or more of the conductive severable shorts may be physically adjacent shorts positioned nearest in proximity to inductor terminals of the ladder-shaped inductor, wherein the second set of one or more of the conductive severable shorts physically lie between the first set of one or more of the conductive severable shorts and the third set of one or more of the conductive severable shorts. The third set of one or more of the conductive severable shorts may be physically adjacent shorts. The method may further include determining a desired change in effective inductance for the ladder-shaped inductor, and selecting, as a function of the desired change in effective inductance, how many of the first set of one or more of the conductive severable shorts to sever, how many of the second set of one or more of the conductive severable shorts to not sever, and how many of the third set of one or more of the conductive severable shorts to sever. The selecting may further include (1) selecting a first number of the first set of one or more of the conductive severable shorts to sever so that (a) a first obtainable operating frequency of the oscillator after severing the first set would be greater than a target operating frequency for the oscillator, and (b) the difference between the first obtainable operating frequency and the target operating frequency is less than a change in operating frequency obtainable by severing a single short, and (2) selecting a second number of the third set of one or more of the conductive severable shorts to sever so that a second obtainable operating frequency of the oscillator after severing the third set is closest to the target operating frequency. The plurality of conductive severable shorts disposed between adjacent sections of the pair of conductive strips may be arranged in a shape of a ladder with the conductive severable shorts forming rungs on the ladder. The oscillator may be part of a radio frequency transceiver implemented within a vehicle radar system.

Embodiments of the present disclosure provide a method for adjusting an effective inductance of a ladder-shaped inductor, wherein the ladder-shaped inductor includes a pair of conductive strips and a plurality of conductive severable shorts disposed between adjacent sections of the pair of conductive strips, wherein the method includes severing a first set of one or more of the conductive severable shorts, not severing a second set of one or more of the conductive severable shorts that lie physically adjacent to the first set of one or more of the conductive severable shorts, and severing a third set of one or more of the conductive severable shorts that lie physically adjacent to the second set of one or more of the conductive severable shorts. The first set of one or more of the conductive severable shorts may be physically adjacent shorts positioned nearest in proximity to inductor terminals of the ladder-shaped inductor, and wherein the second set of one or more of the conductive severable shorts physically lie between the first set of one or more of the conductive severable shorts and the third set of one or more of the conductive severable shorts. The third set of one or more of the conductive severable shorts may be physically adjacent shorts. The method may further include determining a desired change in effective inductance for the ladder-shaped inductor, and selecting, as a function of the desired change in effective inductance, how many of the first set of one or more of the conductive severable shorts to sever, how many of the second set of one or more of the conductive severable shorts to not sever, and how many of the third set of one or more of the conductive severable shorts to sever. The plurality of conductive severable shorts disposed between adjacent sections of the pair of conductive strips may be arranged in a shape of a ladder with the conductive severable shorts forming rungs on the ladder. In accordance with embodiments of the present disclosure, severing of the first set of one or more of the conductive severable shorts and the severing of the second set of one or more of the conductive severable shorts may be performed by a laser beam.

Embodiments of the present disclosure provide an oscillator including a tunable inductor, wherein the tunable inductor includes a plurality of conductive shorts coupled to and arranged in parallel between adjacent portions of a pair of conductive strips in which a first set of one or more of the conductive shorts may be severed, a second set of one or more of the conductive shorts may be not severed, and a third set of one or more of the conductive shorts may be severed, wherein the second set is positioned between the first set and the third set. The first set may include two or more physically adjacent conductive shorts in nearest proximity to terminals of the tunable inductor coupled to operable elements of the oscillator, and wherein the second set may include at least one conductive short physically adjacent to the first set, and wherein the third set may include at least one conductive short physically adjacent to the second set. The third set may be physically separated from the first set by the second set. The third set of one or more of the conductive shorts may further include at least one short that is not severed. The conductive shorts may be arranged in a substantially parallel manner relative to each other, wherein the conductive strips may be arranged in a substantially parallel manner relative to each other. The plurality of conductive shorts disposed between adjacent sections of the pair of conductive strips may be arranged in a shape of a ladder with the conductive shorts forming rungs on the ladder. The oscillator may be part of a radio frequency transceiver implemented within a vehicle radar system.

A number of embodiments of the disclosure have been described. Nevertheless, it will be understood that various modifications may be made without departing from the spirit and scope of the present disclosure. Accordingly, other embodiments are within the scope of the following claims.

The singular forms "a," "an," and "the" include plural referents unless the context clearly dictates otherwise.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, the terms "adjacent" and "adjacently" refer to the proximity of two structures or elements. Particularly, elements that are identified as being "adjacent" may be near or close to each other without necessarily contacting each other, and without other similar elements positioned between them. The exact degree of proximity may in some cases depend on the specific context and any associated figures.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

As used herein, a plurality of items, structural elements (e.g., a plurality of shorts), compositional elements, and/or materials may be presented in a common list for convenience.

However, these lists should be construed as though each member of the list is individually identified as a separate and unique member. Thus, no individual member of such list should be construed as a defacto equivalent of any other member of the same list solely based on their presentation in a common group without indications to the contrary.

What is claimed is:

1. A method for tuning an oscillator that comprises a ladder-shaped inductor, wherein the ladder-shaped inductor comprises a pair of conductive strips and a plurality of conductive severable shorts disposed between adjacent sections of the pair of conductive strips, the method comprising:
    severing a first set of one or more of the conductive severable shorts;
    not severing a second set of one or more of the conductive severable shorts that lie physically adjacent to the first set of one or more of the conductive severable shorts; and
    severing a third set of one or more of the conductive severable shorts that lie physically adjacent to the second set of one or more of the conductive severable shorts.

2. The method as recited in claim 1, wherein the first set of one or more of the conductive severable shorts are physically adjacent shorts positioned nearest in proximity to inductor terminals of the ladder-shaped inductor, and wherein the second set of one or more of the conductive severable shorts physically lie between the first set of one or more of the conductive severable shorts and the third set of one or more of the conductive severable shorts.

3. The method as recited in claim 2, wherein the third set of one or more of the conductive severable shorts are physically adjacent shorts.

4. The method as recited in claim 1, further comprising:
    determining a desired change in effective inductance for the ladder-shaped inductor; and
    selecting, as a function of the desired change in effective inductance, how many of the first set of one or more of the conductive severable shorts to sever, how many of the second set of one or more of the conductive severable shorts to not sever, and how many of the third set of one or more of the conductive severable shorts to sever.

5. The method as recited in claim 4, wherein the selecting further comprises:
    selecting a first number of the first set of one or more of the conductive severable shorts to sever so that (1) a first obtainable operating frequency of the oscillator after severing the first set would be greater than a target operating frequency for the oscillator, and (2) the difference between the first obtainable operating frequency and the target operating frequency is less than a change in operating frequency obtainable by severing a single short; and
    selecting a second number of the third set of one or more of the conductive severable shorts to sever so that a second obtainable operating frequency of the oscillator after severing the third set is closest to the target operating frequency.

6. The method as recited in claim 1, wherein the plurality of conductive severable shorts disposed between adjacent sections of the pair of conductive strips are arranged in a shape of a ladder with the conductive severable shorts forming rungs on the ladder.

7. The method as recited in claim 1, wherein the oscillator is part of a radio frequency transceiver implemented within a vehicle radar system.

8. A method for adjusting an effective inductance of a ladder-shaped inductor, wherein the ladder-shaped inductor comprises a pair of conductive strips and a plurality of conductive severable shorts disposed between adjacent sections of the pair of conductive strips, the method comprising:
    severing a first set of one or more of the conductive severable shorts;
    not severing a second set of one or more of the conductive severable shorts that lie physically adjacent to the first set of one or more of the conductive severable shorts; and
    severing a third set of one or more of the conductive severable shorts that lie physically adjacent to the second set of one or more of the conductive severable shorts.

9. The method as recited in claim 8, wherein the first set of one or more of the conductive severable shorts are physically adjacent shorts positioned nearest in proximity to inductor terminals of the ladder-shaped inductor, and wherein the second set of one or more of the conductive severable shorts physically lie between the first set of one or more of the conductive severable shorts and the third set of one or more of the conductive severable shorts.

10. The method as recited in claim 9, wherein the third set of one or more of the conductive severable shorts are physically adjacent shorts.

11. The method as recited in claim 8, further comprising:
    determining a desired change in effective inductance for the ladder-shaped inductor; and
    selecting, as a function of the desired change in effective inductance, how many of the first set of one or more of the conductive severable shorts to sever, how many of the second set of one or more of the conductive severable shorts to not sever, and how many of the third set of one or more of the conductive severable shorts to sever.

12. The method as recited in claim 8, wherein the plurality of conductive severable shorts disposed between adjacent sections of the pair of conductive strips are arranged in a shape of a ladder with the conductive severable shorts forming rungs on the ladder.

13. The method as recited in claim 8, wherein the severing of the first set of one or more of the conductive severable shorts and the severing of the second set of one or more of the conductive severable shorts is performed by a laser beam.

14. An oscillator comprising a tunable inductor, wherein the tunable inductor comprises a plurality of conductive shorts coupled to and arranged in parallel between adjacent portions of a pair of conductive strips in which:
    a first set of one or more of the conductive shorts are severed;
    a second set of one or more of the conductive shorts are not severed; and
    a third set of one or more of the conductive shorts are severed, wherein the second set is positioned between the first set and the third set.

15. The oscillator as recited in claim 14, wherein the first set includes two or more physically adjacent conductive shorts in nearest proximity to terminals of the tunable inductor coupled to operable elements of the oscillator, and wherein the second set includes at least one conductive short physically adjacent to the first set, and wherein the third set includes at least one conductive short physically adjacent to the second set.

16. The oscillator as recited in claim 15, wherein the third set is physically separated from the first set by the second set.

17. The oscillator as recited in claim 16, wherein the third set of one or more of the conductive shorts further comprises at least one short that is not severed.

18. The oscillator as recited in claim 15, wherein the conductive shorts are arranged in a substantially parallel manner relative to each other, and wherein the conductive strips are arranged in a substantially parallel manner relative to each other.

19. The oscillator as recited in claim 14, wherein the plurality of conductive shorts disposed between adjacent sections of the pair of conductive strips are arranged in a shape of a ladder with the conductive shorts forming rungs on the ladder.

20. The oscillator as recited in claim 14, wherein the oscillator is part of a radio frequency transceiver implemented within a vehicle radar system.

* * * * *